United States Patent
Krishnaraj et al.

(10) Patent No.: US 7,189,639 B2
(45) Date of Patent: Mar. 13, 2007

(54) USE OF GERMANIUM DIOXIDE AND/OR ALLOYS OF GEO2 WITH SILICON DIOXIDE FOR SEMICONDUCTOR DIELECTRIC APPLICATIONS

(75) Inventors: Padmanabhan Krishnaraj, San Francisco, CA (US); Michael S. Cox, Davenport, CA (US); Bruno Geoffrion, South San Francisco, CA (US); Srinivas D. Nemani, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 70 days.

(21) Appl. No.: 11/055,141

(22) Filed: Feb. 10, 2005

(65) Prior Publication Data

US 2006/0178003 A1    Aug. 10, 2006

(51) Int. Cl.
H01L 21/4763    (2006.01)
H01L 21/44    (2006.01)

(52) U.S. Cl. ............ 438/627; 438/758; 438/767; 257/E21.212

(58) Field of Classification Search ............ 438/627
See application file for complete search history.

(56) References Cited

U.S. PATENT DOCUMENTS

| | | | |
|---|---|---|---|
| 5,324,539 A | 6/1994 | Maeda et al. | |
| 5,648,175 A | * 7/1997 | Russell et al. | ............ 428/472.3 |
| 6,040,020 A | 3/2000 | Sandhu et al. | |
| 6,150,029 A | 11/2000 | Sandhu et al. | |
| 6,204,196 B1 | 3/2001 | Sandhu et al. | |
| 2003/0038309 A1 | 2/2003 | Sandhu et al. | |

OTHER PUBLICATIONS

S.M. Fisher et al., "Characterizing B-, P-, and Ge-Doped Silicon Oxide Films for Interlevel Dielectrics," Solid State Technology, pp. 55-64 (Sep. 1993).

* cited by examiner

Primary Examiner—Scott B. Geyer
Assistant Examiner—Elias Ullah
(74) Attorney, Agent, or Firm—Townsend and Townsend and Crew LLP

(57) ABSTRACT

A method is disclosed for depositing a dielectric film on a substrate having a plurality of gaps formed between adjacent raised surfaces disposed in a high density plasma substrate processing chamber substrate. In one embodiment the method comprises flowing a process gas comprising a germanium source, a silicon source and an oxidizing agent into the substrate processing chamber; forming a high density plasma that has simultaneous deposition and sputtering components from the process gas to deposit a dielectric film comprising silicon, germanium and oxygen; and during the step of forming a high density plasma, maintaining a pressure within the substrate processing chamber of less than 100 mTorr while allowing the dielectric film to be heated above its glass transition temperature.

32 Claims, 6 Drawing Sheets

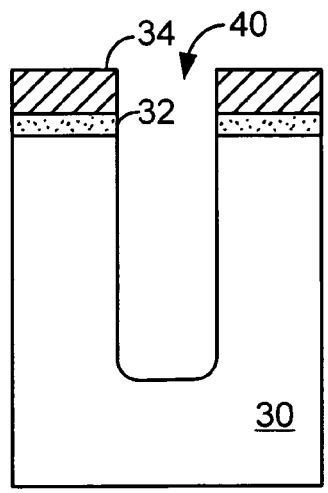
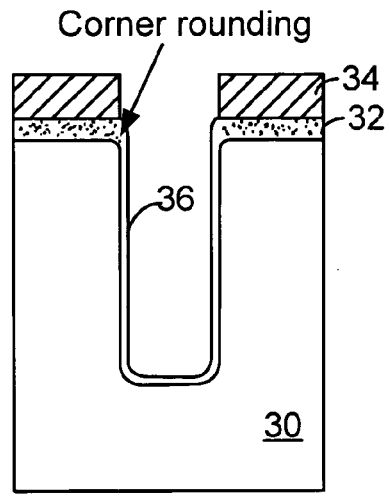
FIG. 2A  FIG. 2B
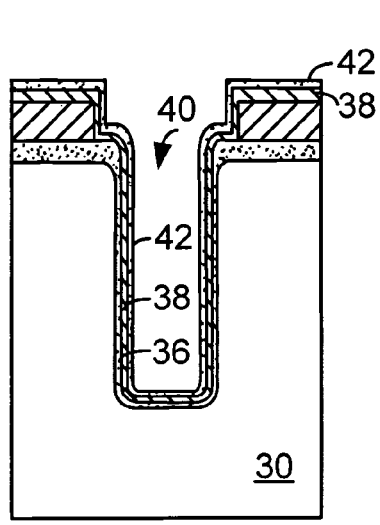
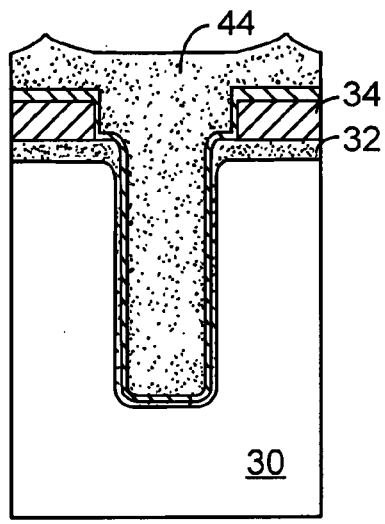
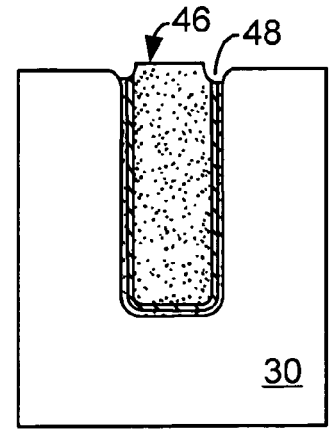
FIG. 2C  FIG. 2D  FIG. 2E

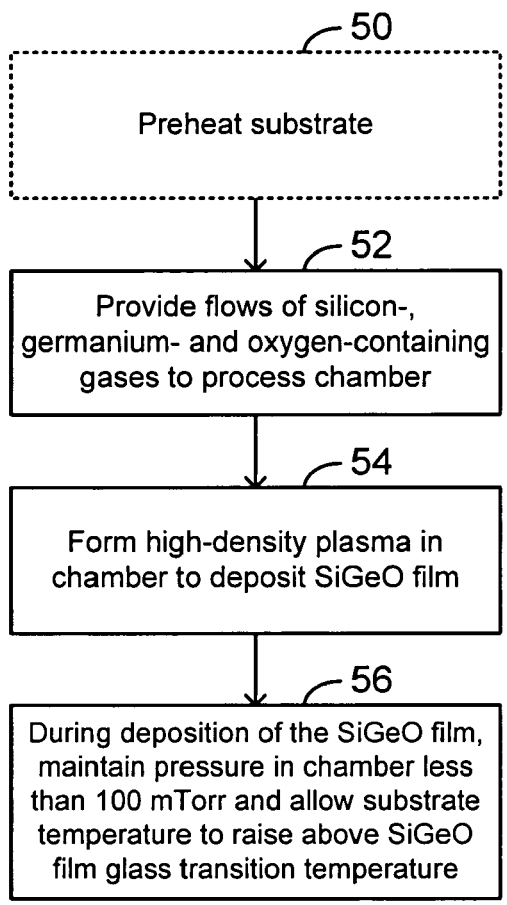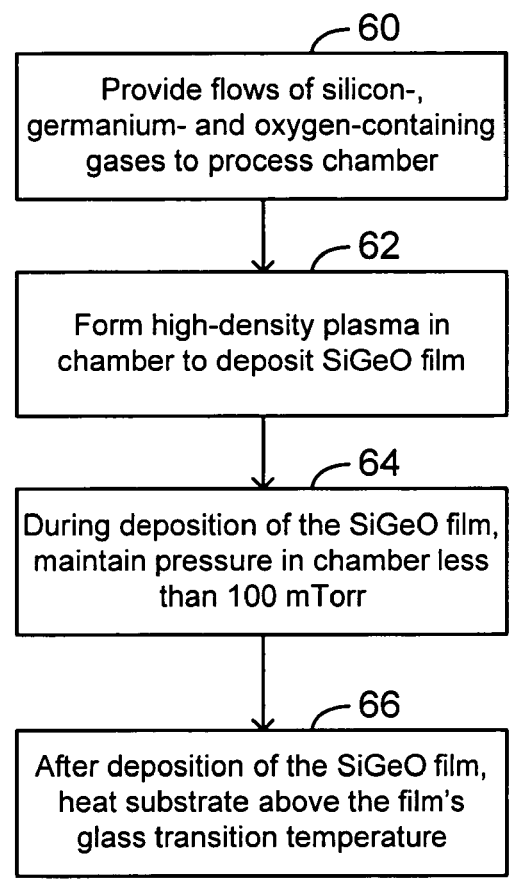
FIG. 3
FIG. 4

USE OF GERMANIUM DIOXIDE AND/OR ALLOYS OF GEO2 WITH SILICON DIOXIDE FOR SEMICONDUCTOR DIELECTRIC APPLICATIONS

BACKGROUND OF THE INVENTION

One common step that may be performed frequently during fabrication of modern semiconductor devices is the formation of a thin film on a semiconductor substrate by chemical reaction of gases. Such deposition processes are referred to generally as chemical vapor deposition ("CVD") and include both thermal CVD processes and plasma-enhanced CVD ("PECVD") process. In conventional thermal CVD processes, reactive gases are supplied to the substrate surface, where heat-induced chemical reactions take place to form the desired film. In a conventional plasma process, a controlled plasma is formed to decompose and/or energize reactive species to produce the desired film.

Any of these CVD techniques may be used to deposit conductive or insulative films during the fabrication of integrated circuits. One important physical property of CVD insulative films includes the film's ability to fill gaps completely between adjacent structures without leaving voids; this property is referred to as the film's gapfill capability. Gaps that may require filling by CVD insulative layers, such as silicon oxide based layers, include spaces between adjacent raised structures such as transistor gates, conductive lines, etched trenches, stacked capacitors or the like.

As semiconductor device geometries have decreased in size over the years, the ratio of the height of such gaps to their width, the so-called "aspect ratio," has increased dramatically. Gaps having a combination of high aspect ratio and a small width present a particular challenge for semiconductor manufacturers to fill completely. In short, the challenge usually is to prevent the deposited film from growing in a manner that closes off the gap before it is filled. Failure to fill the gap completely results in the formation of voids in the deposited layer, which may adversely affect device operation. The semiconductor industry has accordingly been searching aggressively for techniques that may improve gapfill capabilities, particularly with high-aspect-ratio small-width gaps.

High-aspect-ratio gaps are difficult to fill using conventional CVD methods, causing some integrated-circuit manufacturers to turn to the use high-density-plasma CVD ("HDP-CVD") techniques. The use of an HDP-CVD technique results in the formation of a plasma that has a density approximately two orders of magnitude greater than the density of a conventional, capacitively coupled plasma. Examples of HDP-CVD systems include inductively coupled plasma ("ICP") systems and electron-cyclotron-resonance ("ECR") systems, among others. There are a number of advantages of plasma-deposition processes in gapfill applications that are thus enhanced in the case of HDP-CVD deposition processes. For example, the high reactivity of the species in any plasma deposition process reduces the energy required for a chemical reaction to take place, thereby allowing the temperature of the process to be reduced compared with conventional thermal CVD processes; the temperatures of HDP-CVD processes may advantageously be even lower than with PECVD processes because the species reactivity is even higher. Similarly, HDP-CVD systems generally operate at lower pressure ranges than low-density plasma systems. The low chamber pressure provides active species having a long mean-free-path and reduced angular distribution. These factors contribute to a significant number of constituents from the plasma reaching even the deepest portions of closely spaced gaps, providing a film with improved gapfill capabilities.

Another factor that allows films deposited by HDP-CVD techniques to have improved gapfill characteristics is the occurrence of sputtering, promoted by the plasma's high density, simultaneous with film deposition. The sputtering component of HDP deposition slows deposition on certain features, such as the corners of raised surfaces, thereby contributing to the increased gapfill ability of HDP deposited films. Some HDP-CVD processes introduce an inert element that further promotes the sputtering effect, with the choice of inert element often depending on its atomic or molecular weight, a parameter that is generally correlated with the size of the sputtering effect. In addition, the sputtering effect may be further promoted by applying an electric bias with an electrode in the substrate support pedestal to use electrical attraction of the plasma species.

It was initially thought that the simultaneous deposition and etching provided by HDP-CVD processes would allow gaps to be filled in almost any application. Semiconductor manufacturers have discovered, however, that there is a practical limit to the aspect ratio of gaps that HDP-CVD deposition techniques are able to fill. The challenge of filling gaps with HDP-CVD is illustrated schematically with the cross-sectional views shown in FIGS. 1A and 1B. FIG. 1A shows a vertical cross section of a substrate 10, such as may be provided with a semiconductor wafer, having adjacent raised features 20, which may be adjacent metal lines, trench walls, or a variety of other structures. Adjacent features 20 define gaps 14 that are to be filled with dielectric material, with the sidewalls 16 of the gaps being defined by the surfaces of the features 20. As the deposition proceeds, dielectric material 18 accumulates on the surfaces of the features 20, as well as on the substrate 10, and forms overhangs 22 at the corners 24 of the features 20. As deposition of the dielectric material 18 continues, the overhangs 22 typically grow faster than the gap 14 in a characteristic breadloafing fashion. Eventually, the overhangs 22 grow together to form the dielectric film 26 shown in FIG. 1B, preventing deposition into an interior void 28.

In one commonly used process, an HDP-CVD process is used to deposit a silicon oxide film using a process gas that includes monosilane $SiH_4$, molecular oxygen $O_2$, and argon Ar. While such a process has been successfully used to fill certain narrow-width, high-aspect-ratio gaps for many applications, improved and/or alternative techniques are desired.

BRIEF SUMMARY OF THE INVENTION

Embodiments of the invention provide for techniques that allow improved gapfill with HDP-CVD processes. The techniques of the invention are particularly useful for filling trenches associated with shallow trench isolation structures and vertical transistors employed in various in integrated circuits but can be used in a variety of other applications including, but not limited to, the formation of premetal and intermetal dielectric layers in integrated circuits.

According to one embodiment of the invention a method is disclosed for depositing a dielectric film on a substrate disposed in a high density plasma substrate processing chamber substrate, the substrate having a plurality of gaps formed between adjacent raised surfaces. In one embodiment the method comprises flowing a process gas comprising a germanium source, a silicon source and an oxidizing agent into the substrate processing chamber; forming a high density plasma that has simultaneous deposition and sputtering components from the process gas to deposit a dielectric film comprising silicon, germanium and oxygen; and during the step of forming a high density plasma, maintaining a pressure within the substrate processing chamber of less than 100 mTorr while allowing the dielectric film to be heated close to or above its glass transition temperature.

Another embodiment of the method of the invention comprises depositing the dielectric film by flowing a process gas comprising a germanium source, a silicon source and an oxidizing agent into the substrate processing chamber; forming a high density plasma that has simultaneous deposition and sputtering components from the process gas to deposit a dielectric film comprising silicon, germanium and oxygen; and maintaining a pressure within the substrate processing chamber of less than 100 mTorr during the step of forming a high density plasma; and after depositing the dielectric film, stopping flows of the germanium and silicon sources into the substrate processing chamber and flowing the dielectric film by exposing the dielectric film to a high density plasma formed from at least one sputtering agent while allowing the substrate to be heated close to or above its glass transition temperature.

Still another embodiment of the method of the invention comprises depositing a first portion of the dielectric film during a first deposition stage by flowing a process gas comprising a germanium source, a silicon source and an oxidizing agent into the substrate processing chamber; forming a high density plasma that has simultaneous deposition and sputtering components from the process gas; and maintaining a pressure within the substrate processing chamber of less than 100 mTorr; and depositing a second portion of the dielectric film during a second deposition stage, after the first stage, by increasing bias power applied to the substrate processing chamber to heat the dielectric film close to or above its glass transition temperature while maintaining the flow of the process gas into the substrate processing chamber.

In still another embodiment, the method of the invention comprises depositing a dielectric film by flowing a process gas comprising a silicon source, an oxidizing agent and a dopant source into the substrate processing chamber; forming a high density plasma that has simultaneous deposition and sputtering components from the process gas to deposit a dielectric film comprising silicon, oxygen and dopant atoms; and maintaining a pressure within the substrate processing chamber of less than 100 mTorr during the step of forming a high density plasma; and thereafter, exposing the substrate to a high density plasma formed from a gas consisting of the silicon source alone or in combination with one or more gases that do not chemically react with the silicon source in a film forming reaction while biasing the plasma towards the substrate to heat the substrate close to or above the glass transition temperature of the dielectric film.

These and other embodiments of the invention along with many of its advantages and features are described in more detail in conjunction with the text below and attached figures.

BRIEF DESCRIPTION OF THE DRAWINGS

FIGS. 2A–2E are simplified cross-sectional views of a substrate illustrating the formation of a shallow trench isolation structure according to one embodiment of the present invention;

FIG. 3 is a flowchart depicting steps associated with one embodiment of the present invention;

FIG. 4 is a flowchart depicting steps associated with another embodiment of the present invention.

DETAILED DESCRIPTION OF THE INVENTION

Figure 1A:
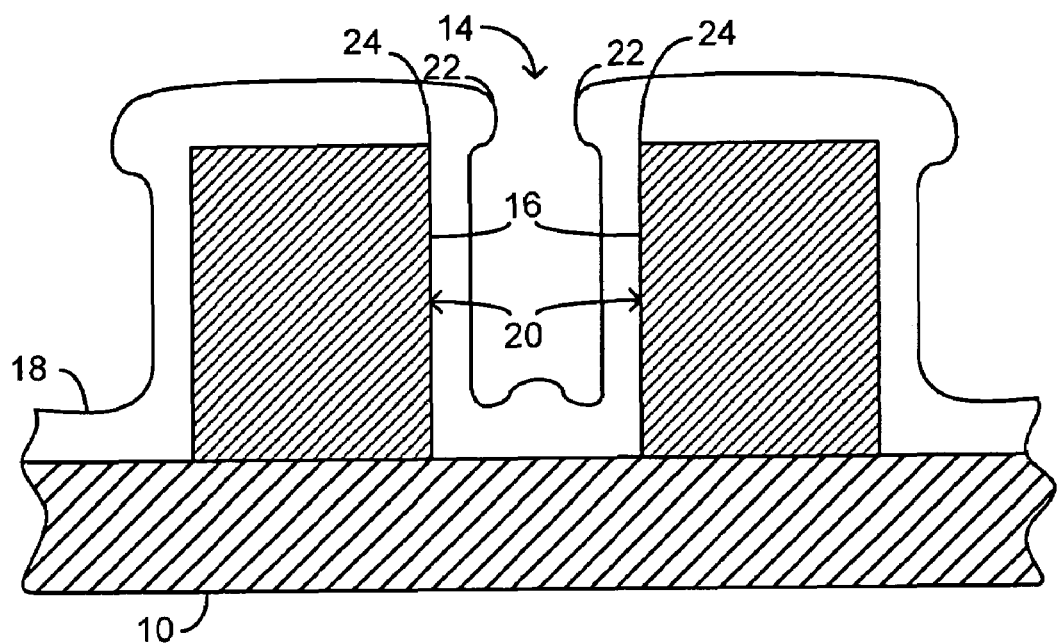
FIGS. 1A and 1B are schematic cross-sectional drawings illustrating the formation of a void during a gapfill process.
Figure 1B:
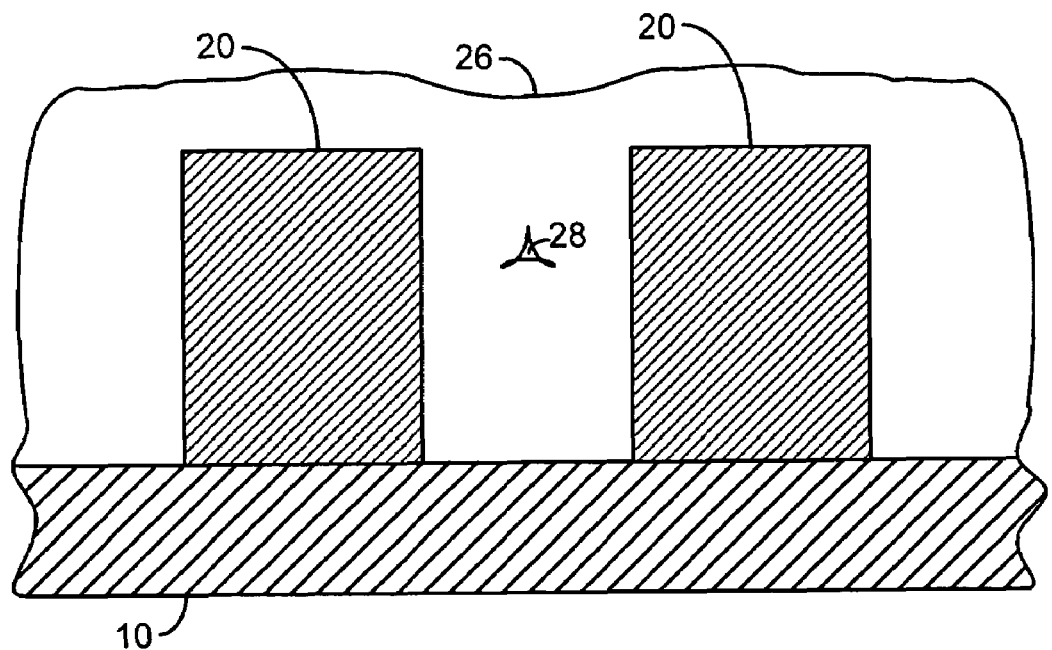

Embodiments of the invention fill trenches and/or gaps between adjacent raised features of integrated circuits by depositing an insulating material that contains silicon, germanium and oxygen into the trenches and/or gaps. The ratio of silicon to germanium in the film may vary depending on the film's application as discussed in detail below. Embodiments of the invention can be used to fill STI trenches, gaps formed between adjacent vertical transistors and other gaps or trenches formed between raised structures formed on a substrate when the substrate can be heated to a temperature close to or above the reflow temperature of the deposited film. Embodiments of the invention permit the dielectric material to be deposited with substantially 100% gapfill for integrated circuits having minimum feature sizes of 0.10 μm or less that include very aggressive gapfill structures having aspect ratios greater than 6:1.

As used herein, references to an HDP-CVD process are intended to refer to a plasma CVD process that includes simultaneous deposition and sputtering components, and that employs a plasma having an ion density on the order of $10^{11}$ ions/cm$^3$ or greater. The relative levels of the combined deposition and sputtering characteristics of the high-density plasma may depend on factors such as the flow rates of various gases included in the gaseous mixture from which the plasma is formed, as well as the source and bias power levels applied to maintain the plasma and bias the plasma towards the substrate, respectively.

Embodiments of the invention deposit a film that has both silicon oxide (Si—O) bonds and germanium oxide (Ge—O) bonds using an HDP-CVD process. Films having both Si—O and Ge—O bonds are sometimes referred to herein as either an SiGeO film, a germanium silicon oxide film or a germanium-doped silicon oxide film. One of the benefits achievable by adding germanium to a silicon oxide-based film is that the germanium reduces the reflow temperature of the film without adding an impurity such as boron, which is highly mobile and undesirable in certain applications. Adding germanium to a silicon oxide based film also improves the surface mobility of the film which also results in better gapfill. Additionally, germanium is in the same group IV type element as silicon and thus diffusion of germanium into a silicon substrate is generally not considered a problem.

Embodiments of the invention add a varying amount of germanium to the film depending on the desired film properties. Generally speaking, the more germanium added to the film, the lower the film's reflow temperature. Germanium dioxide has a reflow temperature of approximately 550° C. while silicon dioxide has a reflow temperature of approximately 1300° C. Alloys that contain various amounts of both $GeO_2$ and $SiO_2$ have a reflow temperature somewhere between 550–1300° C. depending on the amount of germanium oxide relative to silicon oxide formed in the film. Thus, embodiments of the invention allow process engineers to tune the reflow temperature of the deposited film to the specific requirements for a particular application by varying the amount of germanium oxide relative to silicon oxide formed in the film.

The inventors have found that films formed with higher levels of germanium oxide, however, may result in the deposited film having an undesirably high wet etch rate ratio (WERR) for certain applications as explained further below with respect to FIGS. 2A–2E. Also, at very high germanium levels, moisture absorption may become an issue for some applications. Thus, certain embodiments of the invention that are used to lower film reflow temperature and achieve improved gapfill, form an SiGeO film where the amount of $GeO_2$ in the film is between about between about 15–45 percent in the deposited film as measured by inductively-coupled plasma optical emission spectroscopy (ICP-OES) as known to those of skill in the art. In other embodiments, where the film reflow temperature is not as important as just increasing the surface mobility of the film, a smaller amount of germanium is added to the film so that the amount of $GeO_2$ in the deposited SiGeO film is 10 percent or less and preferably between about 2–10%.

The amount of germanium oxide relative to silicon oxide that is incorporated into the film is dependent on the relative flow rates of the respective germanium and silicon source gases. In certain embodiments of the invention, silane ($SiH_4$) is used as the silicon gas and $GeH_4$ is used as the germanium source. In order to achieve approximately a 1:1 ratio of germanium to silicon, equal flows of $GeH_4$ and $SiH_4$ are introduced into the chamber along with an appropriate flow of an oxygen source.

In some applications it is desirable to limit the amount of germanium incorporated into the deposited SiGeO film in order to approximately match the film's WERR to that of silicon dioxide material. This will in turn help reduce the size of divots or dents that may be formed upon planarization of the structure. In order to better illustrate this issue reference is now made to FIGS. 2A–2E, which are simplified cross-sectional drawings of a shallow trench isolation structure being formed. As shown in FIG. 2A, a typical shallow trench isolation structure is formed by etching a trench 40 in a silicon substrate 30. Prior to etching the trench a thin pad oxide layer 32 is typically formed over the surface of substrate 30 and a silicon nitride layer 34 over pad oxide layer 32. The nitride layer acts as a hard mask during subsequent photolithography processes and the pad oxide layer provides adhesion of the nitride to the silicon substrate and protects the substrate when the nitride layer is removed near the end of the STI formation process.

Well known photolithography techniques are then used to pattern the nitride and oxide layers and form trenches 40. Next, as shown in FIG. 2B, a trench lining layer 36, such as an in situ steam generation (ISSG) oxide or other thermal oxide layer is usually formed to remove etch damage and/or residue from the interior of the trench and passivate the silicon surface of the trench providing a stable interface between the silicon and the trench fill material. This process also rounds the corners of the layers that make up trench 40.

As shown in FIG. 2C, some STI applications also form one or more additional lining layers within trench 40, such as a silicon nitride layer 38 and a medium temperature oxide layer 42. Such layers help minimize dopant distribution and also help reduce the size of the dents or divots formed between the silicon substrate and the filled trench as discussed with respect to FIG. 2E. The material of the additional lining layers may also be selected to improve device performance and minimize silicon bending and other issues.

Referring now to FIG. 2D, the trench is filled with trench fill material 44 (SiGeO material) according to the techniques described herein. Then finally, the structure is planarized using, for example, a chemical mechanical polishing (CMP) technique, to remove nitride layer 34 and pad oxide layer 32 and level the gapfill material 44 to the top of the trench (surface 46). The insulating material that remains in the trench provides electrical isolation between active devices formed on neighboring islands of silicon. If gapfill material 44 has a wet etch rate that is different than the wet etch rate of the other materials that form the upper portion of the trench, small dents or divots 48 may form on the surface of the structure at the interface between the silicon substrate and the gapfill dielectric. Minimizing the size of such dents or divots is an important device performance criteria for some integrated circuits. Accordingly, some embodiments of the invention, limit the amount of germanium incorporated into the deposited SiGeO trench fill material in order to approximately match ($\leq 1.5$ x) the film's WERR to that of silicon dioxide material.

In order to better appreciate and further understand various embodiments of the invention, reference is now made to FIG. 3, which is a flow chart depicting the steps associated with deposition of an SiGeO film according to one embodiment of the present invention. As shown in FIG. 3, this embodiment flows separate sources of germanium, silicon and oxygen into an HDP-CVD substrate processing chamber (step 52) and forms a high density plasma in the chamber (step 54) to deposit the SiGeO film. Some embodiments also add a flow of an inert gas such as argon, helium or hydrogen ($H_2$) to the process gas. During the deposition process (step 56), the pressure within the chamber is maintained at or below 100 mTorr, preferably below 10 mTorr in some embodiments, and the temperature is heated close to or above the glass transition temperature of the SiGeO film by using an appropriately high RF bias power during deposition and/or by heating the substrate with a pedestal or other type of heater.

Heating the substrate close to or above its glass transition temperature during deposition of the film allows the SiGeO film to flow during deposition thereby improving the gapfill capability of the film (as used herein, heating the substrate "close to or above" a film's glass reflow temperature includes heating the substrate to a temperature that lowers the viscosity of the film enough to sufficiently fill the feature and includes heating the substrate to a temperature equal to the glass reflow temperature). This approach also eliminates the need for a separate reflow step after deposition has occurred. In some instances, the substrate is pre-heated up to or close to the reflow temperature of the SiGeO film prior to initiating deposition of the film (step 50). This can be done, for example, by exposing the substrate to an inert gas plasma, such as an argon plasma, prior to introducing the silicon and germanium sources into the chamber. In some embodiments, the plasma is continuously maintained between steps 50 and 56 while in other embodiments the plasma is extinguished after preheating step 50 is performed and reinitiated when the silicon and germanium sources are introduced into the chamber.

FIG. 4 is a flow chart depicting the steps associated with deposition of an SiGeO film according to another embodiment of the present invention. The embodiment shown in FIG. 4 is similar to the embodiment shown in FIG. 3 except that the SiGeO film is heated close to or above the reflow temperature of the SiGeO material during a separate reflow step 66 after the SiGeO film is deposited. Prior to reflow step 66, the FIG. 4 embodiment flows separate sources of germanium, silicon and oxygen and optionally, an inert gas into an HDP-CVD substrate processing chamber (step 60) and forms a high density plasma in the chamber (step 62) to deposit the SiGeO film.

During the deposition process, the pressure within the chamber is maintained at or below 100 mTorr and preferably below 10 mTorr. Since the SiGeO film does not need to flow during the deposition steps, bias power applied during steps 60–64 can be kept relatively low (e.g., less than 5000 W in a 300 mm chamber (<7.08 W/cm$^2$)) in order to not cause corner clipping, plasma damage or other undesirable effects. Also, while not shown in FIG. 4, in some embodiments, the substrate can be preheated to a desired deposition temperature using a plasma similar to the plasma formed in step 30 of the FIG. 3 embodiment.

After the SiGeO film is deposited, the film is then heated close to or above its reflow temperature of the dielectric layer (step 66) to allow the deposited SiGeO film to reflow. In one embodiment the substrate is heated in step 66 by exposing the substrate to a plasma in the HDP-CVD chamber and applying a relatively high bias to the substrate during step 66. The plasma is then maintained for an appropriate time to allow the reflow process to fill the gaps. In some embodiments the plasma is biased towards the substrate by applying an RF bias power of at least 5 W/cm$^2$ and more preferably at least 10 W/cm$^2$. Also, in some embodiments, the amount of RF bias power applied to the substrate during step 66 is at least 1.2 times the amount applied during the film deposition step while in other embodiments the amount is at least 1.5 times the amount applied during the film deposition step.

In one particular embodiment the reflow plasma is formed from one or more of the following gases: argon, oxygen, helium and hydrogen. In another embodiment step 66 exposes the substrate to a plasma in the HDP-CVD chamber formed from the silicon source used in the deposition step (e.g., silane) either alone or in conjunction with a gas that does not chemically react with the silicon source in a film forming reaction, such as argon, helium, hydrogen or the like. In still other embodiments, step 66 includes transferring the substrate to another chamber, such as an RTP station or anneal chamber, where it is subject to a heat treatment step.

In some embodiments step 66 exposes the substrate to an HDP plasma for between 90 and 240 seconds while applying a RF bias power of at least 2 W/cm$^2$ to the substrate and more preferably at least 10 W/cm$^2$. Generally, during step 66 the temperature of the substrate is increased by at least 100° C. or 150° C. above the temperature reached during deposition of the SiGeO layer due to the higher RF bias levels and increased sputtering that occur in the reflow step as opposed to the deposition step. In some embodiments, the temperature of the substrate reaches between about 500–650° C. during deposition of the SiGeO film and reaches greater than 750° C., and preferably greater than 800° C., during step 66.

In embodiments were the plasma is constituted of one or more of argon, oxygen, helium and hydrogen, the plasma may sputter away significant amounts of film deposited during steps 60–64. Thus, in such embodiments, the prior deposition process should deposit enough SiGeO material to take the sputtering amount into account. For example, if the desired ending thickness for the SiGeO film is 7000 Å and step 66 sputters 2000 Å away from the film, 9000 Å of film should be deposited in steps 60-64 in order to have a 7000 Å SiGeO film after the completion of step 66.

In embodiments where a silicon source, such as silane, is used as the main gas in combination with one or more of argon, helium, hydrogen or other inert gases, amorphous silicon is deposited and sputtered away simultaneously during step 66 limiting the amount of SiGeO2 sputtered off the film deposited in steps 60–64. The inventors have also found that the presence of silane in the reflow plasma results in a higher wafer temperature than is achieved with a plasma formed solely from one or more of argon, oxygen, helium and hydrogen in the same time frame. Thus, such a silane including plasma may achieve improved reflow and improved gapfill when compared to other approaches.

Figure 5:
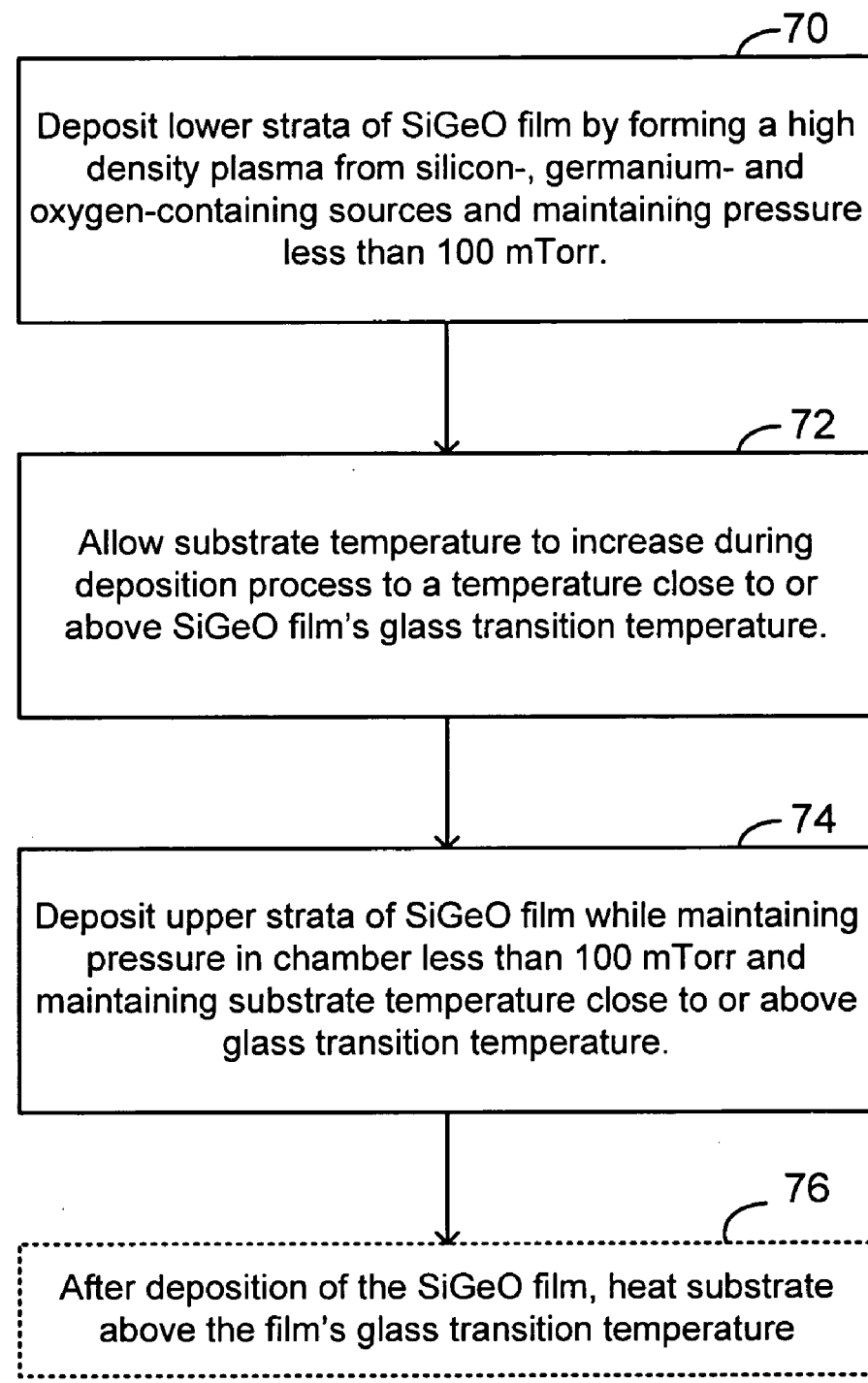
FIG. 5 is a flowchart depicting steps associated with still another embodiment of the present invention.

FIG. 5 is a flow chart depicting the steps associated with deposition of an SiGeO film according to still another embodiment of the present invention. The embodiment shown in FIG. 5 includes two deposition steps. In a first step 70, a lower portion or strata of an SiGeO film is deposited by forming a high density plasma from silicon, germanium and oxygen sources introduced into an HDP-CVD chamber. Chamber pressure is kept at or below 100 mTorr and preferably at or below 10 mTorr. The lower strata of the SiGeO film is deposited at a temperature less than the film's glass transition temperature. During the deposition of the lower strata, however, the temperature of the substrate is increased (e.g., it is heated by the plasma) to a temperature close to or above the glass transition temperature of the SiGeO material (step 72).

The deposition process continues to deposit a second strata of the SiGeO material at the higher temperature (step 74) during which period the viscous nature of the SiGeO material, including the first strata of SiGeO film, flows within the gap to improve the overall gapfill capability of the material. In some embodiments second deposition step 74 lasts for at least a sufficient time to allow the SiGeO material deposited in the gap to adequately flow and fill the gap. In other embodiments an additional post deposition heating step 76 is performed that is similar to step 66 discussed above with respect to FIG. 4 except the duration of the additional step 76 heating step may shortened due to some film reflow occurring during deposition step 74.

In one particular embodiment, the transition from steps 70 to 74 occurs by increasing the RF bias power applied to the substrate from a relatively low value in step 70 to a higher value in step 74. For example, the deposition process may start using a RF bias power level of between 2000–4000 Watts in a 300-mm chamber in order to not cause plasma damage or corner clipping problems. At this level of RF bias power, the temperature of the substrate will increase during deposition but will generally not reach a value high enough to cause the deposited SiGeO layer to reflow. Then, the bias power is increased to a level between 7000–10,000 Watts, which in turn greatly increases the amount of sputtering that occurs during film deposition and the temperature of the substrate. Enough SiGeO material is deposited in step 70 in order to ensure that corner clipping from the increased sputtering is not a problem. As another example, the deposition process may start using an RF bias power level that will allow the substrate to be heated to a temperature between about 500–650° C. during step 70 and reaches greater than 750° C., and preferably greater than 800° C., during step 74.

In some embodiments bias power is increased in step 74 by a factor of at least 1.2 times the bias power used in step 70, and in other embodiments by a factor. In some embodiments, the flow rate of the source gas(es) for one or more sputtering constituents in the plasma may also be increased along with the increase in bias power. For example, the flow rate of argon may be increased from a rate of 0–200 sccm in step 70 to a rate of between 250–500 in the step 74.

Exemplary Substrate Processing System

Figure 6A:
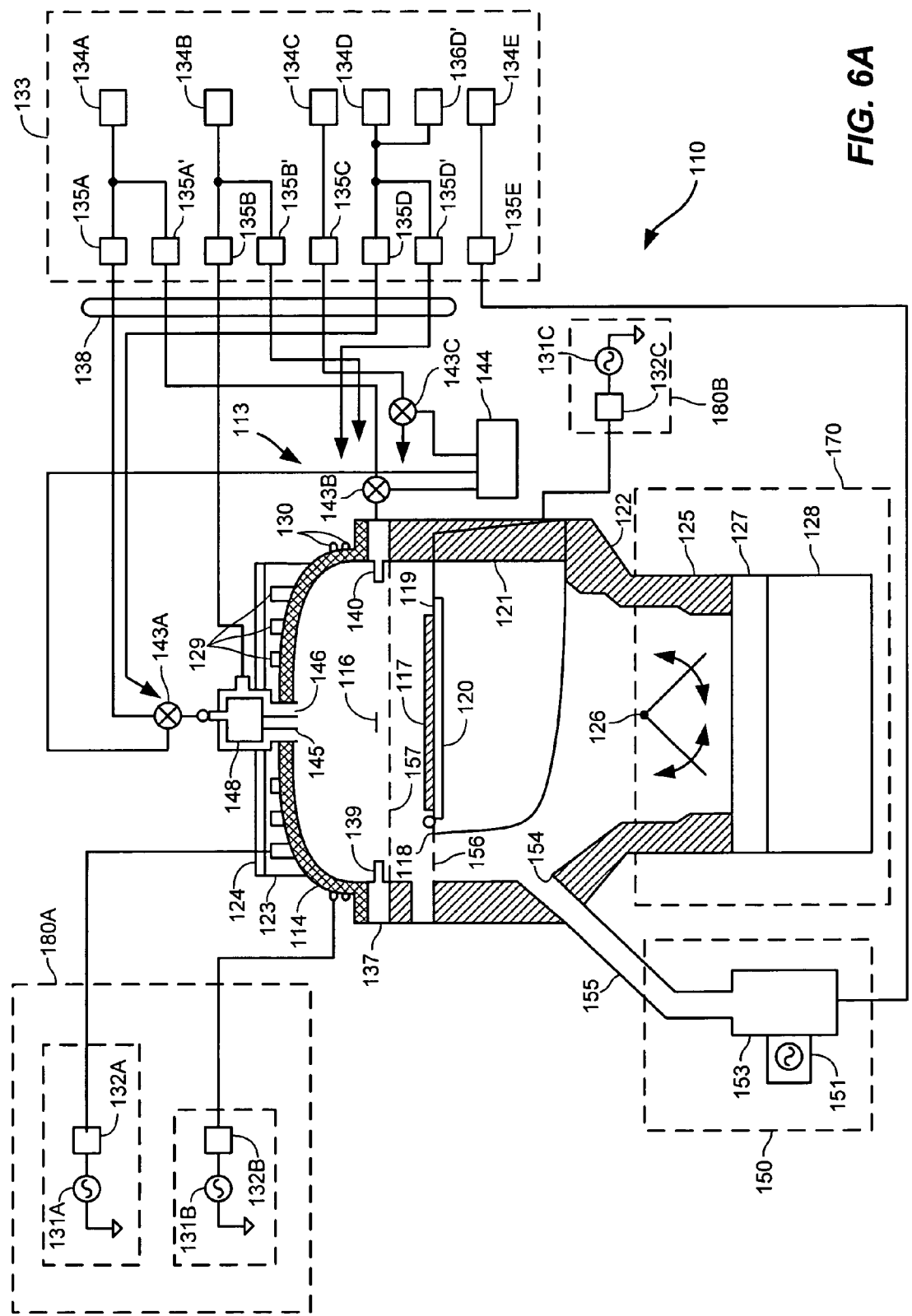
FIG. 6A is a simplified diagram of one embodiment of an HDP-CVD system according to the present invention.
Figure 6B:
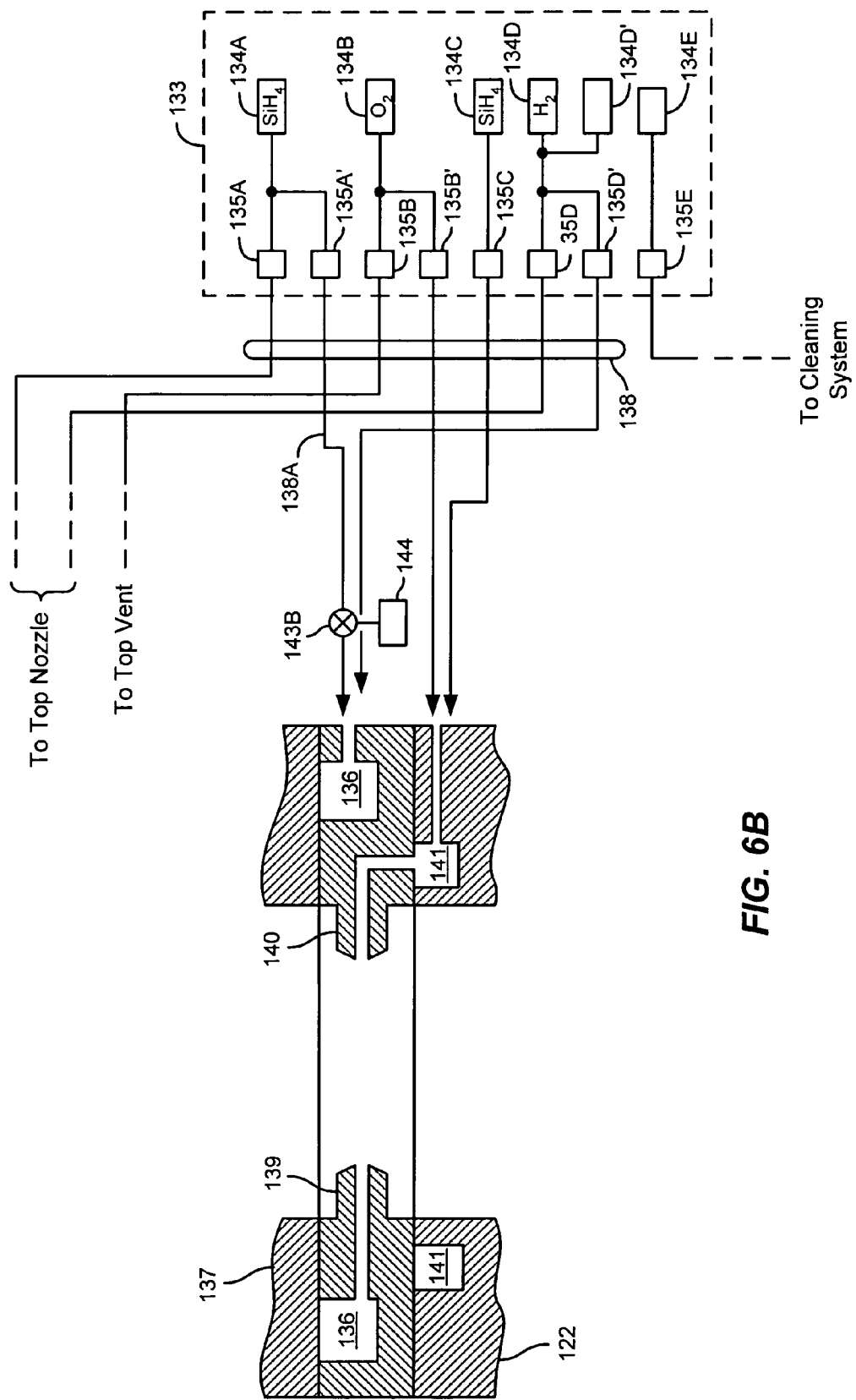
FIG. 6B is a simplified cross section of a gas ring that may be used in conjunction with the exemplary HDP-CVD processing chamber of FIG. 5A.

The methods described above may be implemented with a variety of HDP-CVD systems, one of which is described in detail in connection with FIGS. 6A–6B. FIG. 6A schematically illustrates the structure of such an HDP-CVD system 110 in one embodiment. The system 110 includes a chamber 113, a vacuum system 170, a source plasma system 180A, a bias plasma system 180B, a gas delivery system 133, and a remote plasma cleaning system 150.

The upper portion of chamber 113 includes a dome 114, which is made of a ceramic dielectric material, such as aluminum oxide or aluminum nitride. Dome 114 defines an upper boundary of a plasma processing region 116. Plasma processing region 116 is bounded on the bottom by the upper surface of a substrate 117 and a substrate support member 118.

A heater plate 123 and a cold plate 124 surmount, and are thermally coupled to, dome 114. Heater plate 123 and cold plate 124 allow control of the dome temperature to within about ±10° C. over a range of about 100° C. to 200° C. This allows optimizing the dome temperature for the various processes. For example, it may be desirable to maintain the dome at a higher temperature for cleaning or etching processes than for deposition processes. Accurate control of the dome temperature also reduces the flake or particle counts in the chamber and improves adhesion between the deposited layer and the substrate.

The lower portion of chamber 113 includes a body member 122, which joins the chamber to the vacuum system. A base portion 121 of substrate support member 118 is mounted on, and forms a continuous inner surface with, body member 122. Substrates are transferred into and out of chamber 113 by a robot blade (not shown) through an insertion/removal opening (not shown) in the side of chamber 113. Lift pins (not shown) are raised and then lowered under the control of a motor (also not shown) to move the substrate from the robot blade at an upper loading position 157 to a lower processing position 156 in which the substrate is placed on a substrate receiving portion 119 of substrate support member 118. Substrate receiving portion 119 includes an electrostatic chuck 120 that secures the substrate to substrate support member 111 during substrate processing. In a preferred embodiment, substrate support member 118 is made from an aluminum oxide or aluminum ceramic material.

Vacuum system 170 includes throttle body 125, which houses twin-blade throttle valve 126 and is attached to gate valve 127 and turbo-molecular pump 128. It should be noted that throttle body 125 offers minimum obstruction to gas flow, and allows symmetric pumping. Gate valve 127 can isolate pump 128 from throttle body 125, and can also control chamber pressure by restricting the exhaust flow capacity when throttle valve 126 is fully open. The arrangement of the throttle valve, gate valve, and turbo-molecular pump allow accurate and stable control of chamber pressures from between about 1 mTorr to about 2 torr.

The source plasma system 180A includes a top coil 129 and side coil 130, mounted on dome 114. A symmetrical ground shield (not shown) reduces electrical coupling between the coils. Top coil 129 is powered by top source RF (SRF) generator 131A, whereas side coil 130 is powered by side SRF generator 131B, allowing independent power levels and frequencies of operation for each coil. This dual coil system allows control of the radial ion density in chamber 113, thereby improving plasma uniformity. Side coil 130 and top coil 129 are typically inductively driven, which does not require a complimentary electrode. In a specific embodiment, the top source RF generator 131A provides up to 2,500 watts of RF power at nominally 2 MHz and the side source RF generator 131B provides up to 5,000 watts of RF power at nominally 2 MHz. The operating frequencies of the top and side RF generators may be offset from the nominal operating frequency (e.g. to 1.7–1.9 MHz and 1.9–2.1 MHz, respectively) to improve plasma-generation efficiency.

A bias plasma system 180B includes a bias RF ("BRF") generator 131C and a bias matching network 132C. The bias plasma system 180B capacitively couples substrate portion 117 to body member 122, which act as complimentary electrodes. The bias plasma system 180B serves to enhance the transport of plasma species (e.g., ions) created by the source plasma system 180A to the surface of the substrate. In a specific embodiment, bias RF generator provides up to 5,000 watts of RF power at 13.56 MHz.

RF generators 131A and 131B include digitally controlled synthesizers and operate over a frequency range between about 1.8 to about 2.1 MHz. Each generator includes an RF control circuit (not shown) that measures reflected power from the chamber and coil back to the generator and adjusts the frequency of operation to obtain the lowest reflected power, as understood by a person of ordinary skill in the art. RF generators are typically designed to operate into a load with a characteristic impedance of 50 ohms. RF power may be reflected from loads that have a different characteristic impedance than the generator. This can reduce power transferred to the load. Additionally, power reflected from the load back to the generator may overload and damage the generator. Because the impedance of a plasma may range from less than 5 ohms to over 900 ohms, depending on the plasma ion density, among other factors, and because reflected power may be a function of frequency, adjusting the generator frequency according to the reflected power increases the power transferred from the RF generator to the plasma and protects the generator. Another way to reduce reflected power and improve efficiency is with a matching network.

Matching networks 132A and 132B match the output impedance of generators 131A and 131B with their respective coils 129 and 130. The RF control circuit may tune both matching networks by changing the value of capacitors within the matching networks to match the generator to the load as the load changes. The RF control circuit may tune a matching network when the power reflected from the load back to the generator exceeds a certain limit. One way to provide a constant match, and effectively disable the RF control circuit from tuning the matching network, is to set the reflected power limit above any expected value of reflected power. This may help stabilize a plasma under some conditions by holding the matching network constant at its most recent condition.

Other measures may also help stabilize a plasma. For example, the RF control circuit can be used to determine the power delivered to the load (plasma) and may increase or decrease the generator output power to keep the delivered power substantially constant during deposition of a layer.

A gas delivery system 133 provides gases from several sources, 134A–134E chamber for processing the substrate via gas delivery lines 138 (only some of which are shown). As would be understood by a person of skill in the art, the actual sources used for sources 134A–134E and the actual connection of delivery lines 138 to chamber 113 varies depending on the deposition and cleaning processes executed within chamber 113. Gases are introduced into chamber 113 through a gas ring 137 and/or a top nozzle 145. FIG. 6B is a simplified, partial cross-sectional view of chamber 113 showing additional details of gas ring 137.

In one embodiment, first and second gas sources, 134A and 134B, and first and second gas flow controllers, 135A' and 135B', provide gas to ring plenum 136 in gas ring 137 via gas delivery lines 138 (only some of which are shown). Gas ring 137 has a plurality of source gas nozzles 139 (only one of which is shown for purposes of illustration) that provide a uniform flow of gas over the substrate. Nozzle length and nozzle angle may be changed to allow tailoring of the uniformity profile and gas utilization efficiency for a particular process within an individual chamber. In a preferred embodiment, gas ring 137 has 12 source gas nozzles made from an aluminum oxide ceramic.

Gas ring 137 also has a plurality of oxidizer gas nozzles 140 (only one of which is shown), which in a preferred embodiment are co-planar with and shorter than source gas nozzles 139, and in one embodiment receive gas from body plenum 141. In some embodiments it is desirable not to mix source gases and oxidizer gases before injecting the gases into chamber 113. In other embodiments, oxidizer gas and source gas may be mixed prior to injecting the gases into chamber 113 by providing apertures (not shown) between body plenum 141 and gas ring plenum 136. In one embodiment, third, fourth, and fifth gas sources, 134C, 134D, and 134D', and third and fourth gas flow controllers, 135C and 135D', provide gas to body plenum via gas delivery lines 138. Additional valves, such as 143B (other valves not shown), may shut off gas from the flow controllers to the chamber. In implementing certain embodiments of the invention, source 134A comprises a silane $SiH_4$ source, source 134B comprises a molecular oxygen $O_2$ source, source 134C comprises a silane $SiH_4$ source, source 134D comprises a helium He source, and source 134D' comprises a molecular hydrogen $H_2$ source.

In embodiments where flammable, toxic, or corrosive gases are used, it may be desirable to eliminate gas remaining in the gas delivery lines after a deposition. This may be accomplished using a 3-way valve, such as valve 143B, to isolate chamber 113 from delivery line 138A and to vent delivery line 138A to vacuum foreline 144, for example. As shown in FIG. 6A, other similar valves, such as 143A and 143C, may be incorporated on other gas delivery lines. Such three-way valves may be placed as close to chamber 113 as practical, to minimize the volume of the unvented gas delivery line (between the three-way valve and the chamber). Additionally, two-way (on-off) valves (not shown) may be placed between a mass flow controller ("MFC") and the chamber or between a gas source and an MFC.

Referring again to FIG. 6A, chamber 113 also has top nozzle 145 and top vent 146. Top nozzle 145 and top vent 146 allow independent control of top and side flows of the gases, which improves film uniformity and allows fine adjustment of the film's deposition and doping parameters. Top vent 146 is an annular opening around top nozzle 145. In one embodiment, first gas source 134A supplies source gas nozzles 139 and top nozzle 145. Source nozzle MFC 135A' controls the amount of gas delivered to source gas nozzles 139 and top nozzle MFC 135A controls the amount of gas delivered to top gas nozzle 145. Similarly, two MFCs 135B and 135B' may be used to control the flow of oxygen to both top vent 146 and oxidizer gas nozzles 140 from a single source of oxygen, such as source 134B. The gases supplied to top nozzle 145 and top vent 146 may be kept separate prior to flowing the gases into chamber 113, or the gases may be mixed in top plenum 148 before they flow into chamber 113. Separate sources of the same gas may be used to supply various portions of the chamber.

A remote microwave-generated plasma cleaning system 150 is provided to periodically clean deposition residues from chamber components. The cleaning system includes a remote microwave generator 151 that creates a plasma from a cleaning gas source 134E (e.g., molecular fluorine, nitrogen trifluoride, other fluorocarbons or equivalents) in reactor cavity 153. The reactive species resulting from this plasma are conveyed to chamber 113 through cleaning gas feed port 154 via applicator tube 155. The materials used to contain the cleaning plasma (e.g., cavity 153 and applicator tube 155) must be resistant to attack by the plasma. The distance between reactor cavity 153 and feed port 154 should be kept as short as practical, since the concentration of desirable plasma species may decline with distance from reactor cavity 153. Generating the cleaning plasma in a remote cavity allows the use of an efficient microwave generator and does not subject chamber components to the temperature, radiation, or bombardment of the glow discharge that may be present in a plasma formed in situ. Consequently, relatively sensitive components, such as electrostatic chuck 120, do not need to be covered with a dummy wafer or otherwise protected, as may be required with an in situ plasma cleaning process.

An example of a system that may incorporate some or all of the subsystems and routines described above would be the ULTIMA™ system, manufactured by APPLIED MATERIALS, INC., of Santa Clara, Calif., configured to practice the present invention. Further details of such a system are disclosed in commonly assigned U.S. Pat. No. 6,170,428, filed Jul. 15, 1996, entitled "Symmetric Tunable Inductively-Coupled HDP-CVD Reactor," having Fred C. Redeker, Farhad Moghadam, Hirogi Hanawa, Tetsuya Ishikawa, Dan Maydan, Shijian Li, Brian Lue, Robert Steger, Yaxin Wang, Manus Wong and Ashok Sinha listed as co-inventors, the disclosure of which is incorporated herein by reference. The described system is for exemplary purpose only. It would be a matter of routine skill for a person of skill in the art to select an appropriate conventional substrate processing system and computer control system to implement the present invention.

Table 1 below sets forth typical process parameters that may be used according to one embodiment of the invention to deposit a SiGeO film using a substrate processing chamber similar to that described above configured for processing 300-mm diameter substrates and using the approach described in conjunction with FIG. 3.

TABLE 1

| Parameter | SiGeO Deposition |
| --- | --- |
| Top RF Power (W) | 2000–9000 |
| Side RF Power (W) | 2500–9000 |
| Bias Power (W) | 2500–9000 |
| Chamber Pressure (mTorr) | ≦50 |
| $SiH_4$ Flow (sccm) | 50–250 |
| $GeH_4$ Flow (sccm) | 10–250 |
| $O_2$ Flow (sccm) | 100–500 |
| Time (sec) | (to desired thickness) |

Tables 2 and 3 below set forth typical process parameters that may be used according to two embodiments of the invention to deposit a SiGeO film using a substrate processing chamber similar to that described above configured for processing 300-mm diameter substrates and using the approach described in conjunction with FIG. 4.

TABLE 2

| Parameter | Deposition Phase | Reflow Phase |
| --- | --- | --- |
| Top RF Power (W) | 2000–7500 | 2000–9000 |
| Side RF Power (W) | 2500–9000 | 2500–9000 |
| Bias Power (W) | 2000–6000 | 7000–10,000 |
| Chamber Pressure (mTorr) | ≦50 | ≦50 |
| SiH$_4$ Flow (sccm) | 15–250 | 0 |
| O$_2$ Flow (sccm) | 25–500 | 25–500 |
| Ar Flow (sccm) | 0–200 | 0–500 |
| Time (sec) | (to desired thickness) | 90–240 sec |

TABLE 3

| Parameter | Deposition Phase | Reflow Phase |
| --- | --- | --- |
| Top RF Power (W) | 2000–9000 | 2000–9000 |
| Side RF Power (W) | 2500–9000 | 2500–9000 |
| Bias Power (W) | 2000–6000 | 7000–10,000 |
| Chamber Pressure (mTorr) | 1–50 | 1–50 |
| SiH$_4$ Flow (sccm) | 15–250 | 15–200 |
| O$_2$ Flow (sccm) | 25–500 | 0 |
| Ar Flow (sccm) | 0 | 10–500 |
| Time (sec) | (to desired thickness) | 90–240 sec |

The description above has been given to help illustrate the principles of this invention. It is not intended to limit the scope of this invention in any way. A large variety of variants are apparent, which are encompassed within the scope of this invention. For example, when plasma reflow step 66 described above in conjunction with FIG. 4 employs a silicon source, such as silane, to sputter and heat the substrate, the inventors have found that the substrate can be heated to a temperature significantly above what it can be heated to using a plasma formed from an inert gas, such as argon. This increased temperature may allow the reflow step to be employed to improve the gapfill capabilities of a variety of doped silica glass films including phosphorous-doped silica glass (PSG), fluorine-doped silica glass (FSG), BPSG and others. Accordingly, in Also, while the text associated with FIGS. 3–5 and the actual figures themselves discuss various steps of different embodiments of the invention as occurring in a sequential order, a person of skill in the art will appreciate that these steps may overlap or occur in a different order than depicted. For example, FIG. 3 states that flows of silicon, germanium and oxygen gases are introduced into the chamber in step 52 and a plasma is formed in the chamber in step 54. This description, and similarly the descriptions for FIGS. 4 and 5, does not preclude a plasma being formed prior to the introduction of each of the silicon, germanium and oxygen gases. For example, some embodiments of the invention may form an initial plasma from just the oxygen gas, or from oxygen and an inert gas, or from the silicon and oxygen gases prior to introducing the germanium flow. While the invention has been described in detail and with reference to specific examples thereof, it will be apparent to one skilled in the art that various changes and modifications can be made therein without departing from the spirit and scope thereof. These equivalents and alternatives are intended to be included within the scope of the present invention.

What is claimed is:

1. A method of depositing a dielectric film on a substrate disposed in a high density plasma substrate processing chamber, the substrate having a plurality of gaps formed between adjacent raised surfaces, the method comprising:
    flowing a process gas comprising a germanium source, a silicon source and an oxidizing agent into the substrate processing chamber;
    forming a high density plasma that has simultaneous deposition and sputtering components from the process gas to deposit a dielectric film comprising silicon, germanium and oxygen; and
    during the step of forming a high density plasma, maintaining a pressure within the substrate processing chamber of less than 100 mTorr while allowing the dielectric film to be heated close to or above its glass transition temperature.

2. The method of claim 1 wherein the process gas further comprises a sputtering agent selected from the group consisting of argon, helium and molecular hydrogen.

3. The method of claim 2 wherein the process gas further comprises a phosphorus source.

4. The method of claim 1 or 2 wherein the process gas does not comprise a boron containing source.

5. The method of claim 1 wherein the process gas consists essentially of a germanium source, a silicon source, an oxidizing agent and one or more sputtering agents selected from the group consisting of argon, helium and molecular hydrogen.

6. The method of claim 5 wherein the germanium source comprises GeH$_4$, the silicon source comprises SiH$_4$ and, the oxidizing agent comprises O$_2$.

7. The method of claim 6 wherein the sputtering agent consists of argon.

8. The method of claim 1 wherein the amount of GeO$_2$ in the dielectric film is between 15 45 percent as measured by ICP-OES techniques.

9. The method of claim 1 wherein the amount of GeO$_2$ in the dielectric film is between 2 10 percent as measured by ICP-OES techniques.

10. A method of forming a dielectric film on a substrate disposed in a high density plasma substrate processing chamber, the substrate having a plurality of gaps formed between adjacent raised surfaces, the method comprising:
    depositing the dielectric film by flowing a process gas comprising a germanium source, a silicon source and an oxidizing agent into the substrate processing chamber; forming a high density plasma that has simultaneous deposition and sputtering components from the process gas to deposit a dielectric film comprising silicon, germanium and oxygen; and
    maintaining a pressure within the substrate processing chamber of less than 100 mTorr during the step of forming a high density plasma; and
    after depositing the dielectric film, stopping flows of the germanium and silicon sources into the substrate processing chamber and flowing the dielectric film by exposing the dielectric film to a high density plasma formed from at least one sputtering agent while allowing the substrate to be heated close to or above its glass transition temperature.

11. The method of claim 10 further comprising, during the step of depositing the dielectric film, maintaining the dielectric film at a temperature less than its glass transition temperature.

12. The method of claim 10 wherein radio frequency power is applied to the substrate processing chamber to bias the plasma towards the substrate during step of depositing the dielectric film and during the step of flowing the dielectric film and wherein bias power applied to the substrate processing chamber during the step of flowing the dielectric film is at least 1.2 times higher than bias power applied to the substrate processing chamber during the step of depositing the dielectric film.

13. The method of claim 10 wherein the process gas further comprises a sputtering agent selected from the group consisting of argon, helium and molecular hydrogen.

14. The method of claim 13 wherein the process gas further comprises a phosphorus source.

15. The method of claim 10 or 13 wherein the process gas does not comprise a boron containing source.

16. The method of claim 10 wherein the process gas consists essentially of a germanium source, a silicon source, an oxidizing agent and one or more sputtering agents selected from the group consisting of argon, helium and molecular hydrogen.

17. The method of claim 16 wherein the germanium source comprises $GeH_4$, the silicon source comprises $SiH_4$ and the oxidizing agent comprises $O_2$.

18. The method of claim 17 wherein the sputtering agent consists of argon.

19. The method of claim 10 wherein the amount of $GeO_2$ in the dielectric film is between 15 45 percent as measured by ICP-OES techniques.

20. A method of depositing a dielectric film comprising silicon, germanium and oxygen on a substrate disposed in a high density plasma substrate processing chamber, the substrate having a plurality of gaps formed between adjacent raised surfaces, the method comprising:
    depositing a first portion of the dielectric film during a first deposition stage by flowing a process gas comprising a germanium source, a silicon source and an oxidizing agent into the substrate processing chamber; forming a high density plasma that has simultaneous deposition and sputtering components from the process gas; and maintaining a pressure within the substrate processing chamber of less than 100 mTorr; and
    depositing a second portion of the dielectric film during a second deposition stage, after the first stage, by increasing bias power applied to the substrate processing chamber to heat the dielectric film close to or above its glass transition temperature while maintaining the flow of the process gas into the substrate processing chamber.

21. The method of claim 20 wherein the process gas further comprises a sputtering agent selected from the group consisting of argon, helium and molecular hydrogen.

22. The method of claim 20 wherein the process gas further comprises a phosphorus source.

23. The method of claim 20 wherein the process gas does not comprise a boron containing source.

24. The method of claim 20 wherein the germanium source comprises $GeH_4$, the silicon source comprises $SiH_4$ and the oxidizing agent comprises $O_2$.

25. The method of claim 20 wherein the amount of $GeO_2$ in the dielectric film is between 15 45 percent as measured by ICP-OES techniques.

26. A method of forming a dielectric film on a substrate disposed in a high density plasma substrate processing chamber, the substrate having a plurality of gaps formed between adjacent raised surfaces, the method comprising:
    depositing the dielectric film by flowing a process gas comprising a silicon source, an oxidizing agent and a dopant source into the substrate processing chamber; forming a high density plasma that has simultaneous deposition and sputtering components from the process gas to deposit a dielectric film comprising silicon, oxygen and dopant atoms; and
maintaining a pressure within the substrate processing chamber of less than 100 mTorr during the step of forming a high density plasma; and
    thereafter, exposing the substrate to a high density plasma formed from a gas consisting of the silicon source alone or in combination with one or more gases that do not chemically react with the silicon source in a film forming reaction while biasing the plasma towards the substrate to heat the substrate close to or above the glass transition temperature of the dielectric film.

27. The method of claim 26 wherein the dopant source is a germanium source.

28. The method of claim 27 wherein the silicon source is silane ($SiH_4$).

29. The method of claim 26 wherein the dopant source is selected from the group consisting a fluorine source, a phosphorous source or a boron source.

30. The method of claim 29 wherein the silicon source is silane ($SiH_4$).

31. The method of claim 26 wherein the one or more gases that do not chemically react with the silicon source in a film forming reaction are selected from the group consisting of argon, helium or hydrogen.

32. The method of claim 31 wherein an RF bias of at least 5 Watts/cm$^2$ is applied to the substrate during the reflow step.

* * * * *